(12) United States Patent
Guo (10) Patent No.: US 12,087,359 B2
(45) Date of Patent: Sep. 10, 2024

(54) MEMORY CELL SELECTOR FOR HIGH-VOLTAGE SET AND RESET OPERATIONS

(71) Applicant: Applied Materials, Inc., Santa Clara, CA (US)

(72) Inventor: Frank Tzen-Wen Guo, Danville, CA (US)

(73) Assignee: Applied Materials, Inc., Santa Clara, CA (US)

( * ) Notice: Subject to any disclaimer, the term of this patent is extended or adjusted under 35 U.S.C. 154(b) by 112 days.

(21) Appl. No.: 17/838,718

(22) Filed: Jun. 13, 2022

(65) Prior Publication Data

US 2023/0402093 A1 Dec. 14, 2023

(51) Int. Cl.
*G11C 13/00* (2006.01)
(52) U.S. Cl.
CPC ........ *G11C 13/003* (2013.01); *G11C 2213/79* (2013.01)
(58) Field of Classification Search
CPC .......................... G11C 13/003; G11C 2213/79
See application file for complete search history.

(56) References Cited

U.S. PATENT DOCUMENTS

| | | | |
|---|---|---|---|
| 2006/0023488 A1* | 2/2006 | Yasuda | G11C 11/14 365/100 |
| 2007/0206403 A1 | 9/2007 | Shirahama et al. | |
| 2008/0165573 A1* | 7/2008 | Nirschl | G11C 13/0004 365/163 |
| 2014/0355329 A1 | 12/2014 | Kitagawa et al. | |
| 2015/0109851 A1* | 4/2015 | Higo | G11C 13/003 365/148 |
| 2016/0379710 A1* | 12/2016 | Sekar | G11C 13/004 365/148 |
| 2018/0241392 A1 | 8/2018 | Singh | |
| 2020/0006430 A1* | 1/2020 | McCollum | G11C 13/0011 |
| 2020/0211643 A1* | 7/2020 | Roy | G11C 13/0069 |
| 2020/0227478 A1 | 7/2020 | Han et al. | |

(Continued)

FOREIGN PATENT DOCUMENTS

WO 2018073562 A1 4/2018

OTHER PUBLICATIONS

Application No. PCT/US2023/025162, International Search Report and Written Opinion, Mailed On Oct. 4, 2023, 10 pages.

*Primary Examiner* — Han Yang
(74) *Attorney, Agent, or Firm* — Kilpatrick Townsend & Stockton LLP (57) ABSTRACT

A selector for a memory cell in a memory array may operate by opening different conductive paths to high and low voltages during set and reset operations. A first transistor may open a conductive path between a high voltage and a terminal of the memory element during a reset operation. Similarly, a second transistor may open a conductive path between a low voltage and the terminal of the memory element during a set operation. Some implementations may add a third transistor in series with the first transistor and a fourth transistor in series with the second transistor. The gates of the third and fourth transistors may be biased at a voltage that is about halfway between the low and high voltages. This selector may use smaller transistors while still facilitating high-voltage set and reset operations on resistive memory elements.

20 Claims, 8 Drawing Sheets

(56) References Cited

U.S. PATENT DOCUMENTS

| | | | |
|---|---|---|---|
| 2020/0243545 A1* | 7/2020 | Yamakoshi | H10B 43/10 |
| 2020/0294583 A1* | 9/2020 | Miyazaki | G11C 13/0028 |
| 2021/0035636 A1* | 2/2021 | Nazarian | G11C 13/0069 |
| 2023/0206978 A1* | 6/2023 | Di Vincenzo | G11C 7/12 365/145 |

* cited by examiner

MEMORY CELL SELECTOR FOR HIGH-VOLTAGE SET AND RESET OPERATIONS

TECHNICAL FIELD

This disclosure generally describes a selector circuit for a memory cell in a memory array. More specifically, this disclosure describes a selector suitable for high-voltage set/reset operations on resistive random-access memory (RRAM) elements.

BACKGROUND

Memory arrays may be used to implement many different modern applications. For example, an electronic neural network includes digital and/or analog circuitry that is inspired by, and seeks to approximate, the biological neural networks used by neurological systems found in nature. Like their natural counterparts, electronic neural networks attempt to learn and perform various tasks and recognize input stimuli without being pre-programmed using tasks-specific rules. This learning process may be accomplished using a collection of connected nodes representing artificial neurons which operationally approximate the behavior of neurons in a biological system. Connections between neurons may approximate the behavior of biological synapses to transmit signals between one or more artificial neurons. Multiple successive layers of neuron-and-synapse connections can be chained together to break complex tasks down into incremental stages. Therefore, an electronic neural network can be taught to perform new tasks in the same way that biological neural networks learn and grow over time.

Neural networks and other crossbar memory arrays may rely on combinations of memories and selectors to represent each individual memory element. The memory element represents a persistent memory that typically stores a single bit or multiple bits of information. The selector device paired with the memory element forms a current barrier that limits the leakage current that is experienced when nearby nodes in the memory array are activated on a word or bit line. Functioning selector elements are becoming more important as memory capacity continues to grow and power budgets continue to shrink. Specifically, selector elements are often very large compared to the ever-shrinking memory elements in a memory cell because resistive memory cells may require relatively large voltages/currents during set and reset operations. Therefore, improvements are needed in the art for developing small, efficient, low-power selector devices.

BRIEF SUMMARY

In some embodiments, a memory cell may include a memory element with a first terminal and a second terminal and a selector. The selector may include a first transistor between a first voltage and the first terminal of the memory element; and a second transistor between a second voltage and the first terminal of the memory element, where the first voltage may be higher than the second voltage.

In some embodiments, a selector of a memory cell may include a terminal configured to connect with a terminal of a memory element in the memory cell. The selector may also include a first transistor and a third transistor, where the first transistor may be between a first voltage and the third transistor, and the third transistor may be between the first transistor and the terminal. The selector may also include a second transistor and a fourth transistor, where the second transistor may be between a second voltage and the fourth transistor, the fourth transistor may be between the second transistor and the terminal, and the first voltage may be higher than the second voltage.

In some embodiments, a method of selecting a memory element in a memory array may include receiving a reset signal for the memory element in the memory array; in response to receiving the reset signal for the memory element, opening a conductive path from the memory element to a first voltage through a first transistor; receiving a set signal for the memory element in the memory array; and in response to receiving the set signal for the memory element, opening a conductive path from the memory element to a second voltage through a second transistor.

In any embodiments, any and all of the following features may be implemented in any combination and without limitation. The memory element may include a resistive random-access memory element. The memory element may include a resistive memory film. The first voltage may include a reset voltage greater than or about 3.3 V. The second voltage may include a ground voltage. The first transistor may include a P-channel fin-type field-effect transistor (P-finFET). The second transistor may include an N-channel fin-type field-effect transistor (N-finFET). The second terminal of the memory element may be coupled to a bit line of a memory array. The first transistor may be controlled by a first word line, and the second transistor may be controlled by a second word line. The first word line and the second word line may be derived from a same word line input signal. The selector my also include a third transistor between the first transistor and the first terminal of the memory element where the third transistor may be of a same type as the first transistor; and a fourth transistor between the second transistor and the first terminal of the memory element where the fourth transistor may be of a same type as the second transistor. A gate of the third transistor may be biased at a voltage that is about halfway between the first voltage and the second voltage. A gate of the fourth transistor may be biased at the voltage that is about halfway between the first voltage and the second voltage. A gate of the first transistor and a gate of the second transistor may be connected to outputs of a level shifter, where the level shifter may be configured to receive a word line signal and convert the word line signal into separate control signals for the first transistor and the second transistor. A gate of the first transistor may be connected to a signal that switches between the first voltage and a voltage that is about halfway between the first voltage and the second voltage. A gate of the second transistor may be connected to a signal that switches between the second voltage and a voltage that is about halfway between the first voltage and the second voltage. The method may also include, in response to receiving the reset signal for the memory element, opening the conductive path from the memory element to the first voltage through a third transistor that is in series with the first transistor. The method may further include, in response to receiving the set signal for the memory element, opening a conductive path from the memory element to a second voltage through a fourth transistor that is in series with the second transistor.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

A selector for a memory cell in a memory array may operate by opening different conductive paths to high and low voltages during set and reset operations. A first transistor may open a conductive path between a high voltage and a terminal of the memory element during a reset operation. Similarly, a second transistor may open a conductive path between a low voltage and the terminal of the memory element during a set operation. Some implementations may add a third transistor in series with the first transistor and a fourth transistor in series with the second transistor. The gates of the third and fourth transistors may be biased at a voltage that is about halfway between the low and high voltages. Signals on the gates of the first and second transistors may switch between this intermediate voltage and the high and low voltages, respectively. This selector may use smaller transistors while still facilitating high-voltage set and reset operations on resistive memory elements.

Figure 1:
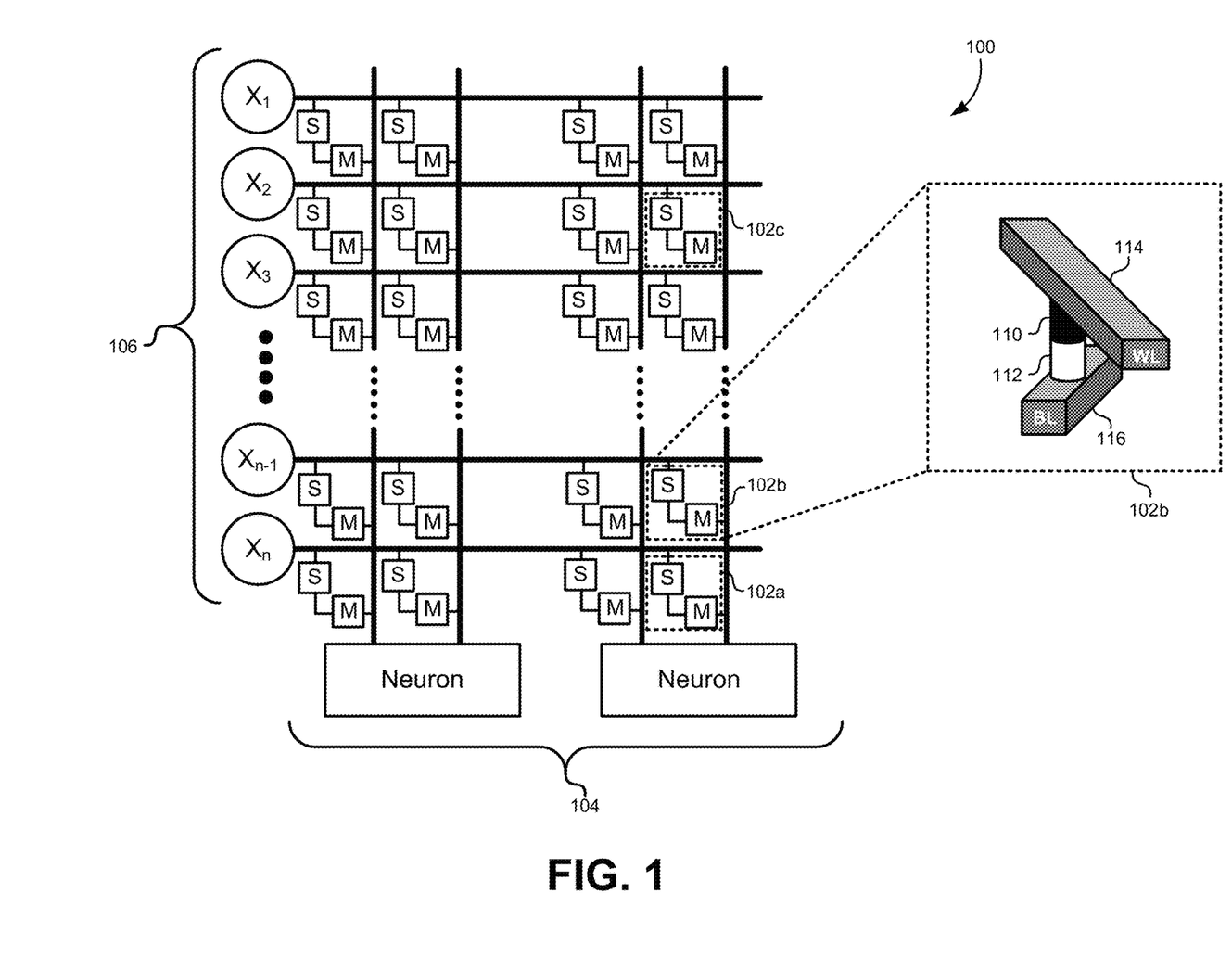
FIG. 1 illustrates a circuit network that implements a neural network, according to some embodiments.

FIG. 1 illustrates a circuit network 100 that implements a neural network, according to some embodiments. While the embodiments described herein may be used in any type of circuit, the circuit network 100 implementing a neural network represents one practical application of these embodiments. However, this neural network application is provided only by way of example and is not meant to be limiting.

FIG. 1 represents a simplified view of a simple neural network where many connections and/or hidden layers may have been omitted for the sake of clearly describing the various circuit components that can be used to represent neurons and synapses. The circuit network 100 includes a plurality of inputs 106 that may be connected to a plurality of devices representing neurons 104 through memory cells 102 representing synapses.

In some embodiments, the synapses may be represented by individual two-terminal memory elements. When using memory devices to model synapses, the circuit network 100 may be viewed as a form of non-volatile memory array. Each of the memory cells 102 representing synapses may be arranged in a rectangular grid pattern. In some embodiments, the grid pattern may be three-dimensional such that multiple grids lie above and below each other, as in a crosspoint memory array. Each of the memory elements may be configured to receive an applied voltage, and based on the polarity of the applied voltage, the memory cells representing the synapses may change a physical state of a material in the memory element to represent a saved logic state, such as a logic 1 and a logic 0. When the voltage is no longer applied, the memory cells 102 may save the logic state induced by the applied voltage, and thus may operate as non-volatile memory elements.

In order to apply the voltage needed to read/write to the memory cells 102, signals may be received from the horizontal lines from the plurality of inputs 106. These horizontal lines may act as a word line in a traditional memory array. The bit lines may run in a perpendicular direction and connect to the output neurons 104. Therefore, applying a voltage between a single one input of the word lines and a single input of the bit lines may cause voltage to be applied across a single one of the memory cells 102 representing synapses. This process can be used to select a single one of the memory cells 102 for a read and/or write operation.

FIG. 1 illustrates a detailed view of a single memory cell 102b. This memory cell 102b uses a word line 114 and a bit line 116 coupled to a select element 110 and a memory element 112. To minimize the leakage current through the circuit network 100, and to isolate memory elements connected on the same word/bit lines, the memory cell 102b may include the select element 110. The select element 110 may be implemented between the memory element 112 and the word line 114. The select element 110 may be used to reduce current from leaking through an individual memory cell 102b and reduce the leakage and power dissipation of the whole array, as well as to prevent disturbances while a memory cell that is passively addressed to access a memory cell on the same bitline/wordline (unless a desired memory cell is selected at a sufficient voltage above the select element threshold received by the memory cell 102b). Therefore, when the voltage is applied to the word line 114 and the bit line 116, the memory cell 102b is accessed while the select elements in memory cell 102a and memory cell 102c may prevent their associated memory elements from being affected by the voltage on the shared bit line 116. Although not shown explicitly in FIG. 1, three-terminal selecting devices may also be used for the select elements, such as transistors, to form a 1T-1 Memory Element cell. Many different technologies may also be used to implement the memory element 112, such as PCMs (Phase Change Memory), oxide-resistive random-access memory (oxR-RAMs) or conductive-bridging memories (CBRAM), ReRAMs, RRAMs, ferroelectric RAMs (FeRAMs), among others.

The embodiments used herein are compatible with many different types of memory elements. For example, a ReRAM is a type of nonvolatile random-access memory (RAM) that operates by changing resistance across a dielectric solid-state material. A ReRAM device is often arranged with a control transistor in a 1 transistor-1 resistor (1T-1R) memory cell architecture. These memory cells may be used in many different applications, including traditional Von Neumann architectures. A Von Neumann architecture is a computer architecture that includes a processing unit with an arithmetic logic unit and processor registers, a control unit with an instruction register and a program counter, memories that store data and instructions, and/or input/output mechanisms. When a 1T-1R memory cell is used in a computer architecture, a filament may be formed between a pair of metal electrodes that causes the memory element to conduct in a relatively high-current state to represent a logic 1 value. This filament may be formed by generating a positive voltage pulse across the drain and source of the transistor. To reset the memory element, a negative voltage pulse may be applied to dissipate the filament and represent a logic 0 value with a relatively high resistance to current flowing across the device. In some embodiments, a resistive memory film may be used as the memory element. Thus, any type of ReRAM memory element may be used in the embodiments described herein.

Figure 2:
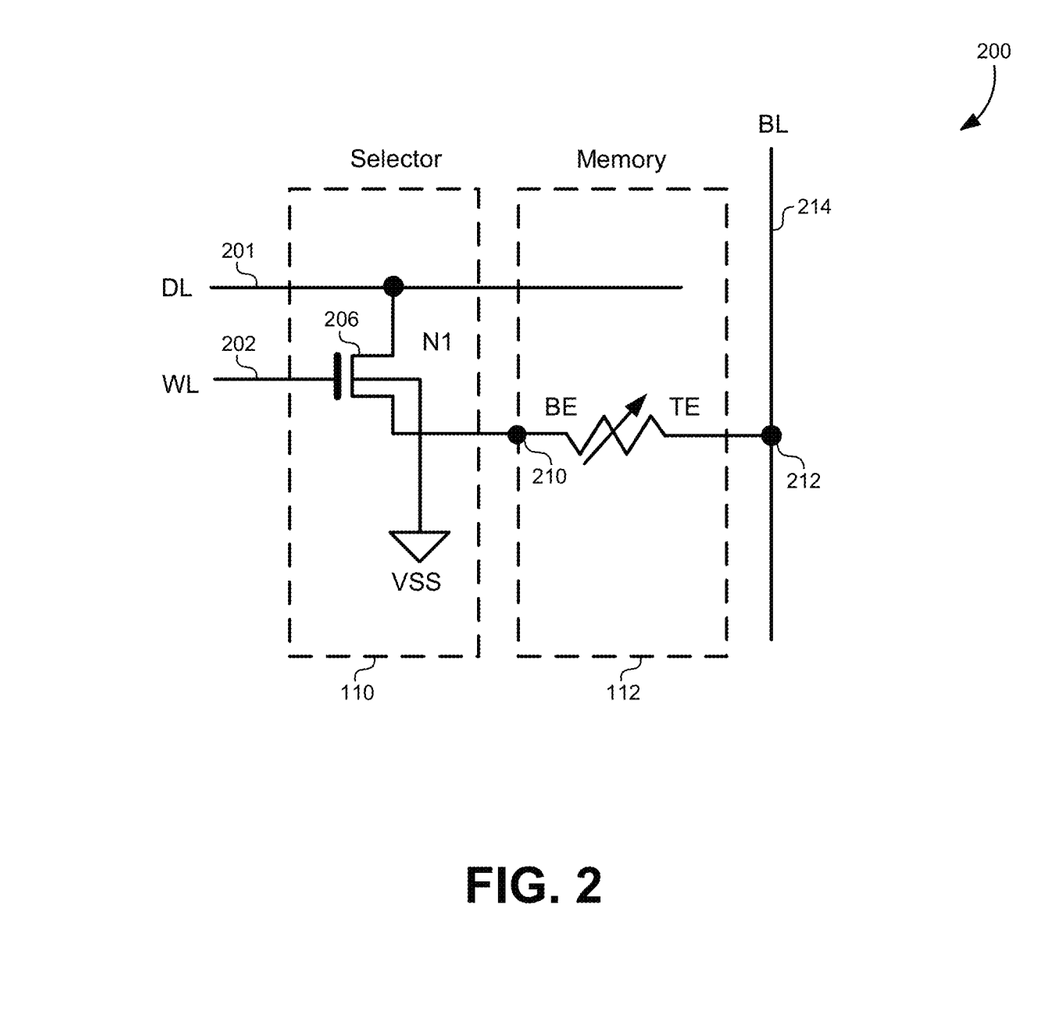
FIG. 2 illustrates a traditional 1T-1R memory cell, according to some embodiments.

FIG. 2 illustrates a traditional 1T-1R memory cell 200, according to some embodiments. This memory cell 200 includes a selector 110 and a memory element 112. By way of example, the memory element 112 may be fabricated using resistive film or any other resistive memory element described in this disclosure. The memory element 112 may include a first terminal 210 and a second terminal 212. These terminals may also be referred to as a bottom electrode and a top electrode, respectively. ReRAM memory elements represent a prominent emerging Back End of Line (BEOL) memory film technology. These memories offer the benefits of a nonvolatile memory capable of multiple conductance levels that is also readily integrated into advanced CMOS processes. These features make ReRAM memory elements attractive options for in-memory multiply accumulation (MAC) computations in neural network applications as described above.

The selector 110 may include a single transistor 206. The transistor 206 may be implemented using an N-channel metal-oxide-semiconductor (NMOS) transistor as depicted in FIG. 2. A gate of the transistor 206 to be controlled by a word line 202 for the memory array. Providing a sufficient positive voltage on the word line 202 may cause the transistor 206 to form a conductive path between a drive line 201 and a first terminal 210 of the memory element 112. The second terminal 212 of the memory element 112 may be connected to the bit line 214. Thus, the memory element 112 may be selected using the word line 202, and then programmed during set and/or reset operations by applying voltages to the driveline 201 and/or the bit line 214.

Despite the advantages provided by ReRAM memory elements, such as the memory element 112 in FIG. 2, ReRAM memory elements often require relatively high programming voltages and currents to perform set and/or reset operations to change the conductance inside of the memory element 112. The transistor 206 may be used to activate the individual memory element 112 in a ReRAM array or stack. When the memory element 112 is activated to perform a set and/or reset operation, the transistor 206 must therefore also handle the high programming voltages and currents for the set and/or reset operations. Because CMOS transistors are scaling smaller in advanced CMOS processes, these transistors often have relatively lower operating voltages. For example, the memory element 112 may require higher voltages and currents than the smaller transistor 206 may be able to provide when the transistor 206 and the memory element 112 are fabricated using the same BEOL advanced CMOS processes. Therefore, larger transistor sizes are often used to implement the selector 110, and the overall size of the memory cell 200 is primarily determined by the size of the transistor 206.

For example, when performing a reset operation to increase the resistance of the memory element 112, a relatively high voltage (e.g., greater than about 3.0 V, greater than about 3.3 V, greater than about 5.0 V, and so forth) may be applied across the memory element 112 from the bottom electrode or first terminal 210 to the top electrode or second terminal 212. This may be accomplished by providing the relatively high programming voltage on the drive line 201, providing a sufficient positive voltage on the word line 202 to open a conductive path through the transistor 206, and allowing current to flow through the memory element 112 from the first terminal 210 to the second terminal 212 and the bit line 214. Thus, the transistor 206 must be capable of holding off the relatively high programming voltage when the transistor 206 is not conducting, and the transistor 206 must also be capable of handling the relatively high programming current through the transistor 206 when the transistor 206 is conducting during a set/reset operation. A set operation to decrease the resistance of the memory element 112 reverses the direction of current flow through the memory element 112 and reverses the voltage across the memory element 112, thereby causing similar technical problems.

Additionally, during a reset operation, the current flows from the driveline 201 through the transistor 206 to the first terminal 210 of the memory element 112. Because the majority of the voltage drop between the drive line 201 and the bit line 214 will occur across the memory element 112, the voltage drop across from the drain to the source of the transistor 206 may be relatively small. This results in a relatively high voltage on the source of the transistor 206. When compared to the smaller gate voltage provided by the word line 202, this relatively high voltage on the source of the transistor 206 will tend to de-bias the transistor and reduce the ability of the transistor 206 to provide the high programming current needed during the reset operation.

Figure 3A:
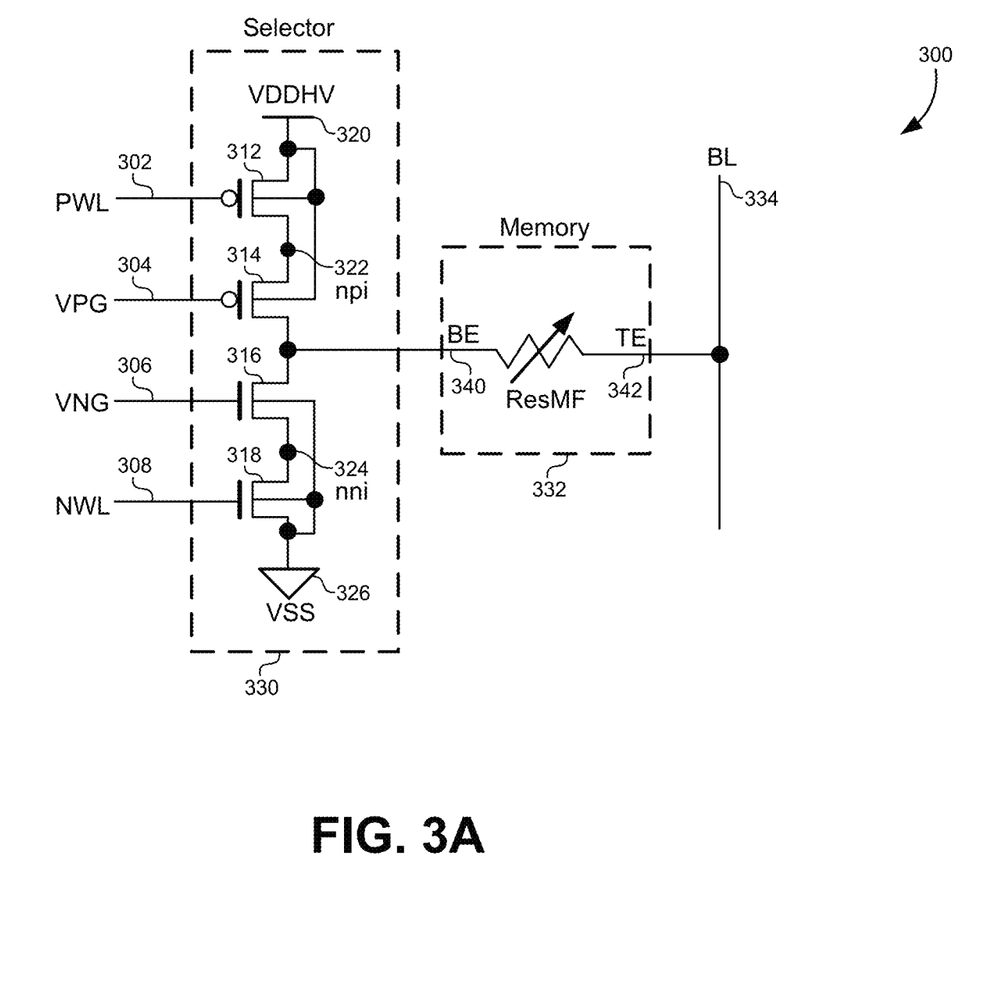
FIG. 3A illustrates a memory cell in a memory array with a selector capable of handling relatively high programming voltages, according to some embodiments.

FIG. 3A illustrates a memory cell 300 in a memory array with a selector 330 capable of handling relatively high programming voltages, according to some embodiments. The memory cell 300 may include a memory element 332, such as a ReRAM element as described above with a bottom electrode 340 and a top electrode 342, along with a bit line 334 connected to the top electrode 342.

Instead including only a single NMOS transistor, the selector 330 may include a plurality of transistors that provide a conductive pathway to a first voltage 320 and a conductive pathway to a second voltage 326. The first voltage 320 may be higher than the second voltage 326. For example, the first voltage 320 may represent the relatively high programming voltage described above, such as a VDDHV voltage in the memory array. The first voltage 320 may be provided from a drive line in the memory array. The first voltage 320 may be greater than or about 3.0 V, greater than or about 3.3 V, greater than or about 3.6, greater than or about 4.0 V, greater than or about 4.5 V, greater than or about 5.0 V, greater than or about 5.3 V, and so forth. The second voltage 326 may represent a ground voltage or VSS voltage in the memory array, which may be adjusted by as much as about 1.0 V. For example, the second voltage 326 may be less than or about 1.0 V, less than or about 0.5 V, less than or about 0.2 V, or about 0.0 V.

During a reset operation, the selector 330 may open a conductive path between the first voltage 320 and the bottom electrode 340 (i.e., the first electrode) of the memory element 332. This conductive path may be opened through one or more transistors, such as P-channel fin-type field-effect transistors (P-finFETs). The example of FIG. 3A uses two P-finFETs, but other embodiments may use a single P-finFET or more than two P-finFETs. Similarly, during a set operation, the selector 330 may open a conductive path between the second voltage 326 and the bottom electrode 340 (i.e., the first electrode) of the memory element 332. This conductive path may be opened through one or more transistors, such as N-channel fin-type field-effect transistors (N-finFETs). The example of FIG. 3A uses two N-finFETs, but other embodiments may use a single N-finFET or more than two N-finFETs.

Note that the terms first, second, third, and/or fourth are used only to distinguish the different transistors illustrated in FIG. 3A from each other. These terms do not describe any functional or physical characteristic of these transistors, nor do they indicate importance, precedence, or order of any type. Although finFETs are used as an example of these transistors, the first transistor 312, second transistor 318, third transistor 314, and/or fourth transistor 316 may represent any type of switching device without limitation.

Other types of transistors may also be used besides finFETs, which are used here only by way of example and are not meant to be limiting. Therefore, these transistors may be more generally referred to as a first transistor 312, a second transistor 318, a third transistor 314, and a fourth transistor 316. The first transistor 312 and the third transistor 314 may be arranged in series as a cascoded pair of transistors having a same type (e.g., P-finFETs). Similarly, the second transistor 318 and the fourth transistor 316 may also be arranged in series as a cascoded pair of transistors having a same type (e.g., N-finFETs).

When a reset operation is performed, the relatively high voltage supply (e.g., VDDHV) of the first voltage 320 will be high enough to meet the requirements for programming the memory element 332. In order to form a conductive path between the first voltage 320 and the bottom electrode 340 of the memory element 332, the PWL signal 302 may be applied to the gate of the first transistor 312, while a constant voltage bias for the VPG signal 304 may be applied to a gate of the third transistor 314. In some embodiments, VPG signal 304 may be provided from the voltage reference that is about halfway between the first voltage 320 and the second voltage 326. For example, when the first voltage 320 is about 3.3 V and the second voltage 326 is ground, the VPG signal 304 may be about 1.6 V. The PWL signal 302 may switch between the first voltage 320 and the voltage of the VPG signal 304. When the memory element 332 is not being reset, the PWL signal 302 may be held at the first voltage 320. In order to program the memory element 332 with a reset signal, the PWL signal 302 may be lowered to the voltage of the VPG signal 304. This forms a conductive path from the first voltage 320 through the first transistor 312 and the third transistor 314 to the bottom electrode 340 of the memory element 332.

When a set operation is performed, the relatively high voltage supply (e.g., VDDHV) may be provided through the bit line 334 instead of the drive line. For example, a voltage having about the same voltage as the first voltage 320 may be provided on the bit line 334 such that current flows through the top electrode 342 of the memory element 332 and out the bottom electrode 340. In order to form a conductive path between the second voltage 326 and the bottom electrode 340 of the memory element 332, the NWL signal 308 may be applied to the gate of the second transistor 318, while a constant voltage bias for the VNG signal 306 may be applied to a gate of the fourth transistor 316. In some embodiments, VNG signal 306 may be provided from the voltage reference that is about halfway between the first voltage 320 and the second voltage 326 as described above for the VPG signal 304. The NWL signal 308 may switch between the second voltage 326 and the voltage of the VNG signal 306. When the memory element 332 is not being set, the NWL signal 308 may be held at the second voltage 326. In order to program the memory element 332 with a set signal, the PWL signal 302 may be raised to the voltage of the VNG signal 306. This forms a conductive path from the second voltage 326 through the second transistor 318 and the fourth transistor 316 to the bottom electrode 340 of the memory element 332.

Figure 3B:
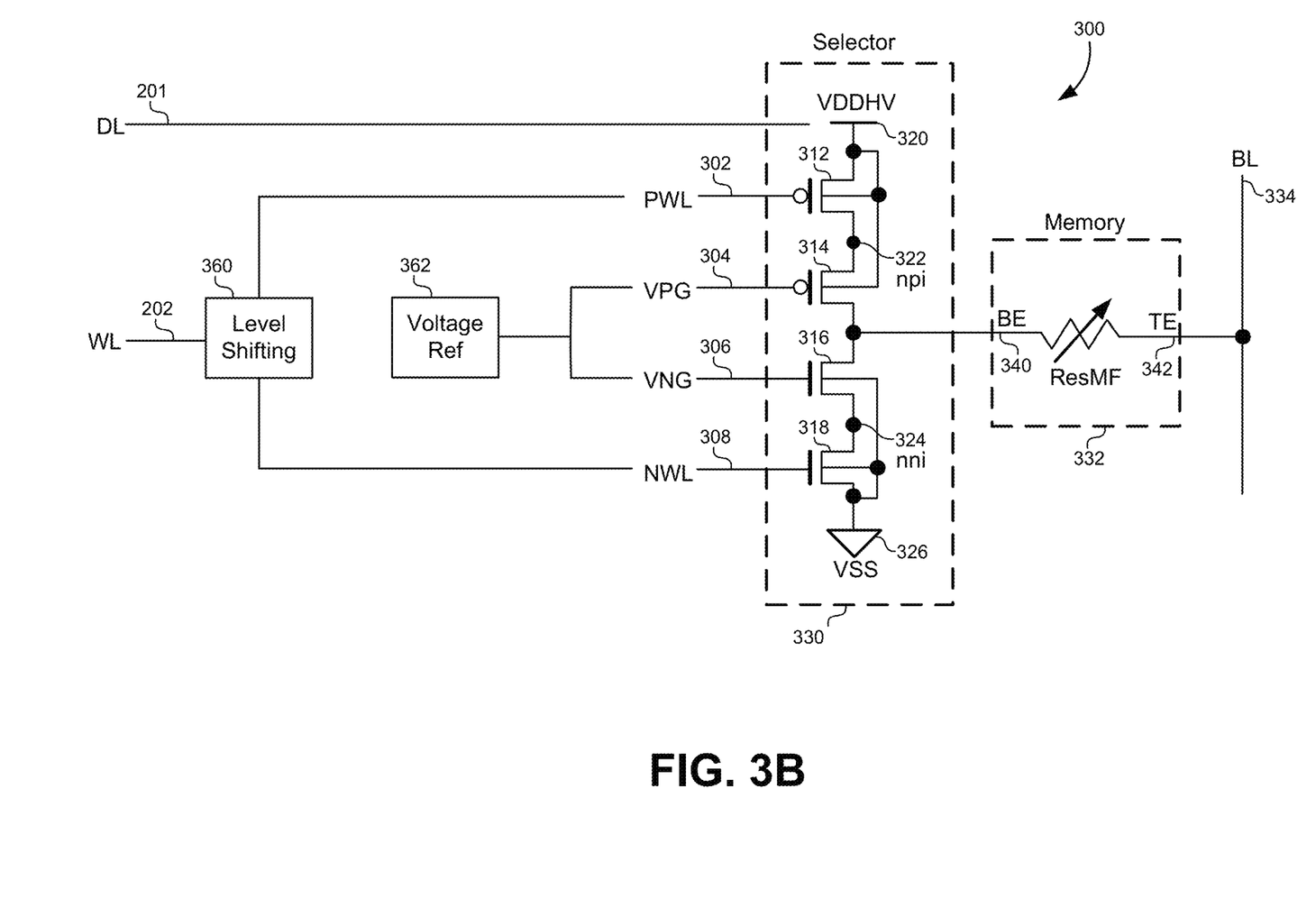
FIG. 3B illustrates how the memory cell may be connected to control signals in a memory array, according to some embodiments.

FIG. 3B illustrates how the memory cell 300 may be connected to control signals in a memory array, according to some embodiments. The first voltage 320 may be connected to the drive line 201 in the memory array. The VPG signal 304 and the VNG 306 may both be supplied from a voltage reference 362. In this example, the same voltage reference 362 may provide the same voltage to both the VPG signal 304 and the VNG signal 306. However, other embodiments may alternatively allow these signals to deviate. For example, two voltage references may be used such that the VPG signal 304 is slightly higher than the VNG signal 306. The PWL signal 302 and the NWL signal 308 may be derived from a word line 202 in the memory array. A level shifter circuit 360 may convert or translate the voltage pulses on the word line 202 signal into the separate control signals for the first transistor in the second transistor with the voltage levels and waveforms illustrated below in FIG. 4. For example, the voltage reference 362 may be used such that the PWL signal 302 switches between VDDHV and VPG during a reset operation.

Figure 4:
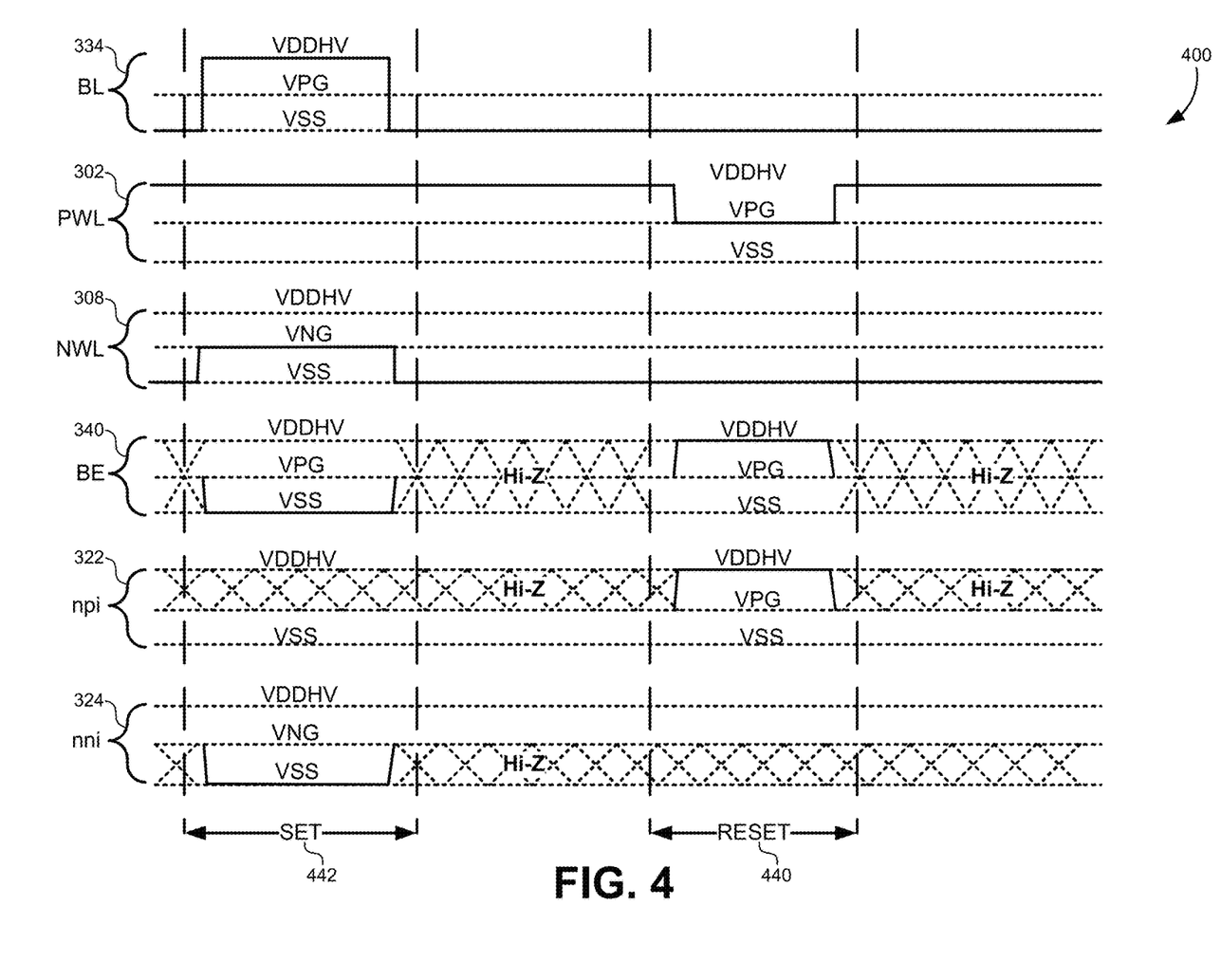
FIG. 4 illustrates a waveform diagram of the different signals in the memory cell during set and reset operations, according to some embodiments.

FIG. 4 illustrates a waveform diagram 400 of the different signals in the memory cell 300 during set and reset operations, according to some embodiments. During a reset operation the conductive path from the first voltage 320 to the bottom electrode 340 of the memory element 332 is opened by switching the PWL signal 302 from the first voltage 320 to the voltage of the VPG signal 304. This causes both the first transistor 312 and the third transistor 314 to conduct. The npi node 322 between the first transistor 312 and the third transistor 314 transitions from a high impedance state to the first voltage 320. When not performing the reset operation, the npi node 322 may be in the high-impedance state, which causes the first voltage 320 to be split between the first transistor 312 and the third transistor 314. The npi node 322 may have a limited voltage range between the first voltage 320 and the voltage of the VPG signal 304.

Similarly, during a set operation the conductive path from the second voltage 326 to the bottom electrode 340 of the memory element 332 is opened by switching the NWL signal 308 from the second voltage 326 to the voltage of the VNG signal 306. This causes both the second transistor 318 and the fourth transistor 316 to conduct. The nni node 324 between the second transistor 318 and the fourth transistor 316 transitions from a high impedance state to the second voltage 326. When not performing the set operation, the nni node 324 in the high-impedance state causes the first voltage 320 to be split between the second transistor 318 and the fourth transistor 316. The nni node 324 may have a limited voltage range between the second voltage 326 and the voltage of the VNG signal 306.

The four of the transistors 312, 314, 316, 318 in the selector 330 may thus be exposed to half of the second voltage 320 (e.g., VDDHV) for the gate, drain, and source nodes, while producing a full VDDHV signal at the bottom electrode 340 and bit line 334 for programming the memory element 332. The only nodes exposed to the full high-voltage are the active regions of the third transistor 314 to the NWELL of the second/fourth transistors, and the active regions of the fourth transistor 316 to the PWELL of the first/third transistors. These PN-junctions have a breakdown voltage that is much higher than the VDDHV of the first voltage 320 due to low WELL doping levels, which allows the selector 330 to handle the high voltage and currents.

The separated pull-up and pull-down conductive paths permit the high-voltage programming operations for both set and reset operations. In the conventional bit cell circuit illustrated in FIG. 2, one of the programming paths runs from the drive line, through the NMOS transistor, through the memory element, to the bit line. The programming voltage and current are substantially lower due to the threshold voltage drop of the NMOS transistor. This forces the set or reset voltage/current to also be substantially lower during these operations. The improved selector 330 in FIG. 3A is able to perform both set and reset operations at the full high-voltage/current requirements.

Figure 5:
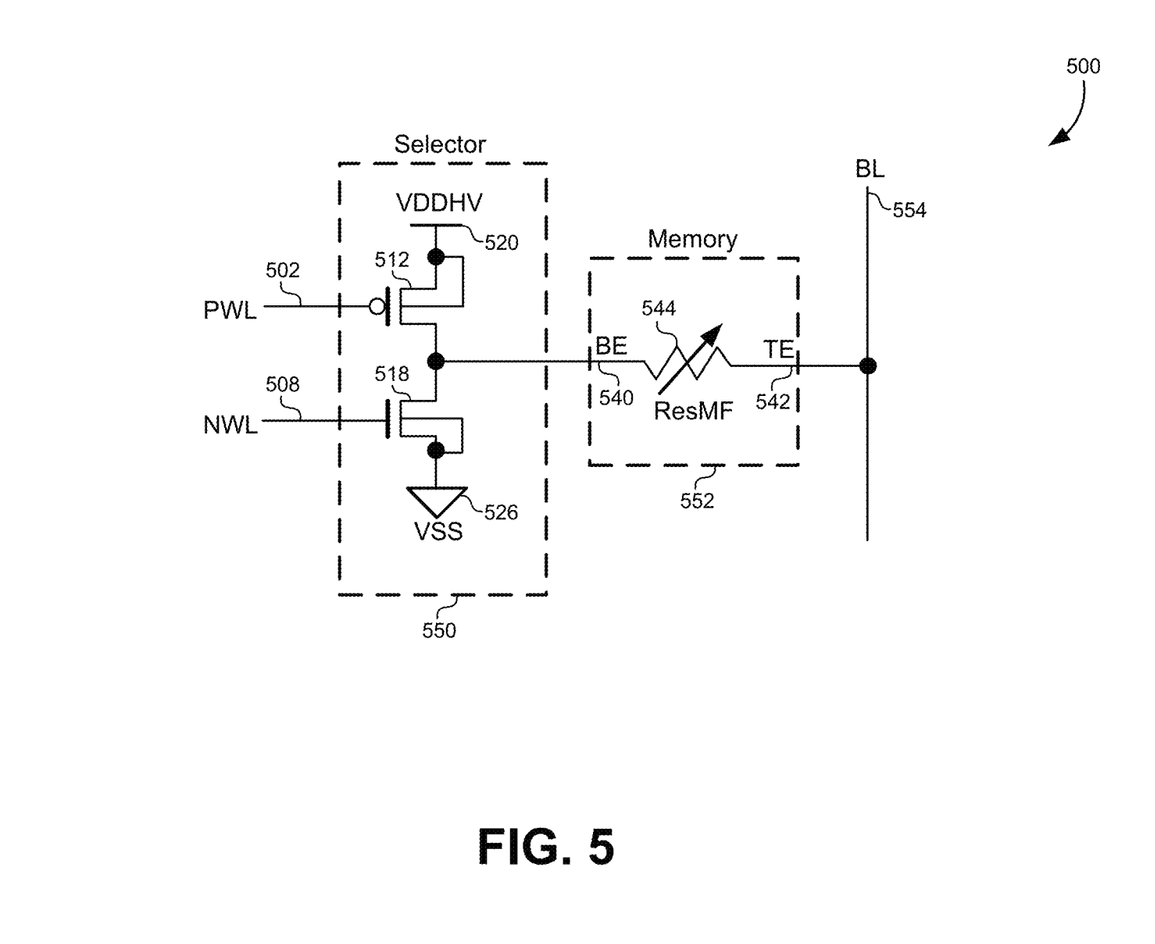
FIG. 5 illustrates a more general version of a selector using two transistors, according to some embodiments.

FIG. 5 illustrates a more general version of a selector 550 using two transistors, according to some embodiments. A memory cell 500 may include a smaller selector 550 that still provides both pull-up and pull-down conductive pathways to a first voltage 520 and to the second voltage 526. However, instead of using two transistors in each conductive path, this selector 550 may use a first transistor 512 and a second transistor 518. The gates of these transistors may be controlled by the PWL signal 502 and the NWL signal 508 as illustrated in FIG. 5. The embodiment of FIG. 5 may also be altered to include the third and/or fourth transistors illustrated and described above in FIG. 3A.

In this configuration, the first transistor 512 and the second transistor 518 may both hold off the full VDDHV voltage. However, since separate pull-up and pull-down conductive paths are created by the two transistors 512, 518, the full program voltage for both set and reset operations may be applied to the memory element 552. For example, the transistors 512, 518 may be implemented using finFETs used in an inverted bit cell circuit configuration rather than a thick-gate, high-voltage configuration. Even though the memory element 552 may be programmed voltages that the thick-gate high-voltage finFETs can handle, using the inverted bit cell circuit configuration with available thin-gate, low-voltage finFETs may result in a significantly smaller overall size for the memory cell 500. Note that the inverted bitcell circuit configurations are not limited to finFET processes. These embodiments may benefit from both the cascoded transistor configuration of FIG. 3A as well as the separated pull-up and pull-down conductive paths in the selectors of FIG. 3A and FIG. 5, regardless of the CMOS processes used.

Figure 6:
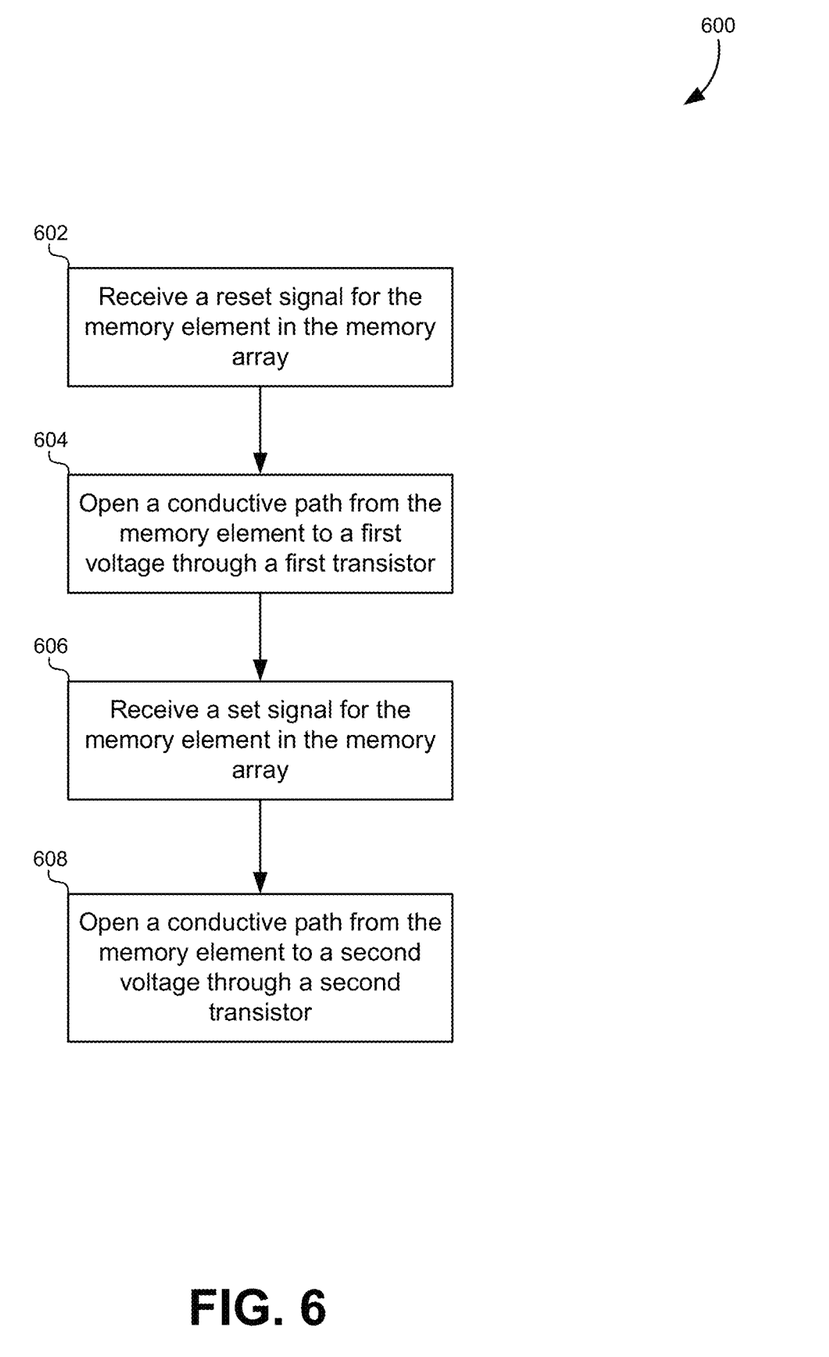
FIG. 6 illustrates a flowchart of a method for selecting a memory element in a memory array, according to some embodiments.

FIG. 6 illustrates a flowchart 600 of a method for selecting a memory element in a memory array, according to some embodiments. The method may include receiving a reset signal for the memory element in the memory array (602). The command to the memory element to provide the reset signal for the memory element may come from a control system, a processor, a microprocessor, a memory controller, and/or any other type of computer system.

For example, as described below in FIG. 7, a processor or microprocessor may be communicatively coupled to one or more memory devices storing instructions that cause the microprocessor to perform operations such as providing the set and/or reset signals described herein. The reset signal may be represented as a drive line, a bit line, and/or signals on a word line that are level-shifted to the voltage levels illustrated above in FIG. 4.

The method may also include opening a conductive path from the memory element to a first voltage through a first transistor (604). The conductive path may be opened in response to receiving the reset signal. The first voltage may include any of the voltages described above, such as the VDDHV voltage. The conductive path may lead to a terminal or bottom electrode of the memory element. The first transistor may include a P-finFET or other type of P-channel transistor. Some embodiments may also include a third transistor that is cascoded in series with the first transistor is illustrated above in FIG. 3A. The conductive path may provide a programming voltage sufficient to reset the memory element.

The method may additionally include receiving a set signal for the memory element in the memory array (606). The set signal may reverse the polarity of the voltage and/or current applied during the reset signal. Like the reset signal, the set signal may be received from a memory controller, processor, microprocessor, or other computer system. The set signal may be represented by voltage levels applied to the word line, drive line, and/or bit line as described above in FIG. 4.

The method may further include opening a conductive path from the memory element to a second voltage the second transistor (608). For example, the conductive path may go from a VSS voltage through the second transistor into a first electrode or bottom electrode of the memory element. In some embodiments, the conductive path may travel through the second transistor and a fourth transistor of the same type. For example, the second transistor and/or the fourth transistor may include N-finFETs or any other type of N-channel devices arranged in a cascoded series. The conductive path may provide a programming voltage that is sufficient to set the memory element.

It should be appreciated that the specific steps illustrated in FIG. 6 provide particular methods of selecting a memory element in a memory array, according to various embodiments. Other sequences of steps may also be performed according to alternative embodiments. For example, alternative embodiments may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. Many variations, modifications, and alternatives also fall within the scope of this disclosure.

As described above, the memory cell may be part of a memory array. The memory array may be included in neural network applications, MAC applications, and/or any other type of integrated circuit. The memory array may also be part of a larger computer system. The signals that control the memory array and the individual memory cells may be provided from a computer system that includes at least a processor or microprocessor and a memory.

Figure 7:
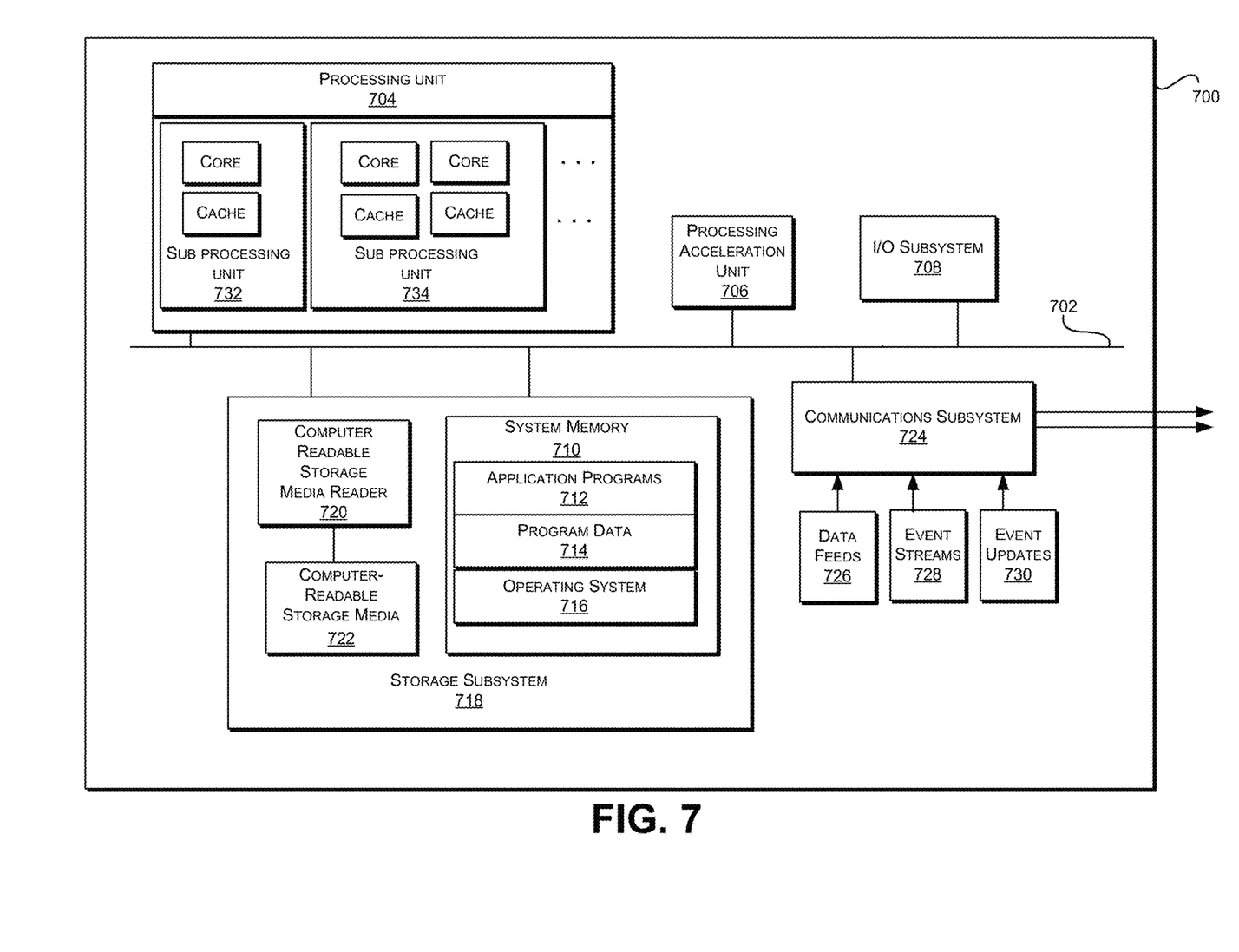
FIG. 7 illustrates an exemplary computer system, in which various embodiments may be implemented.

FIG. 7 illustrates an exemplary computer system 700, in which various embodiments may be implemented. The system 700 may be used to implement any of the computer systems described above. As shown in the figure, computer system 700 includes a processing unit 704 that communicates with a number of peripheral subsystems via a bus subsystem 702. These peripheral subsystems may include a processing acceleration unit 706, an I/O subsystem 708, a storage subsystem 718 and a communications subsystem 724. Storage subsystem 718 includes tangible computer-readable storage media 722 and a system memory 710.

Bus subsystem 702 provides a mechanism for letting the various components and subsystems of computer system 700 communicate with each other as intended. Although bus subsystem 702 is shown schematically as a single bus, alternative embodiments of the bus subsystem may utilize multiple buses. Bus subsystem 702 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 704, which can be implemented as one or more integrated circuits (e.g., a conventional microprocessor or microcontroller), controls the operation of computer system 700. One or more processors may be included in processing unit 704. These processors may include single core or multicore processors. In certain embodiments, processing unit 704 may be implemented as one or more independent processing units 732 and/or 734 with single or multicore processors included in each processing unit. In other embodiments, processing unit 704 may also be implemented as a quad-core processing unit formed by integrating two dual-core processors into a single chip.

In various embodiments, processing unit 704 can execute a variety of programs in response to program code and can maintain multiple concurrently executing programs or processes. At any given time, some or all of the program code to be executed can be resident in processor(s) 704 and/or in storage subsystem 718. Through suitable programming, processor(s) 704 can provide various functionalities described above. Computer system 700 may additionally include a processing acceleration unit 706, which can include a digital signal processor (DSP), a special-purpose processor, and/or the like.

I/O subsystem 708 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 700 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 700 may comprise a storage subsystem 718 that comprises software elements, shown as being currently located within a system memory 710. System memory 710 may store program instructions that are loadable and executable on processing unit 704, as well as data generated during the execution of these programs.

Depending on the configuration and type of computer system 700, system memory 710 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 704. In some implementations, system memory 710 may include multiple different types of memory, such as static random access memory (SRAM) or dynamic random access memory (DRAM). In some implementations, a basic input/output system (BIOS), containing the basic routines that help to transfer information between elements within computer system 700, such as during start-up, may typically be stored in the ROM. By way of example, and not limitation, system memory 710 also illustrates application programs 712, which may include client applications, Web browsers, mid-tier applications, relational database management systems (RDBMS), etc., program data 714, and an operating system 716. By way of example, operating system 716 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 718 may also provide a tangible computer-readable storage medium for storing the basic programming and data constructs that provide the functionality of some embodiments. Software (programs, code modules, instructions) that when executed by a processor provide the functionality described above may be stored in storage subsystem 718. These software modules or instructions may be executed by processing unit 704. Storage subsystem 718 may also provide a repository for storing data used in accordance with some embodiments.

Storage subsystem 700 may also include a computer-readable storage media reader 720 that can further be connected to computer-readable storage media 722. Together and, optionally, in combination with system memory 710, computer-readable storage media 722 may comprehensively represent remote, local, fixed, and/or removable storage devices plus storage media for temporarily and/or more permanently containing, storing, transmitting, and retrieving computer-readable information.

Computer-readable storage media 722 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 700.

By way of example, computer-readable storage media 722 may include a hard disk drive that reads from or writes to non-removable, nonvolatile magnetic media, a magnetic disk drive that reads from or writes to a removable, non-volatile magnetic disk, and an optical disk drive that reads from or writes to a removable, nonvolatile optical disk such as a CD ROM, DVD, and Blu-Ray® disk, or other optical media. Computer-readable storage media 722 may include, but is not limited to, Zip® drives, flash memory cards, universal serial bus (USB) flash drives, secure digital (SD) cards, DVD disks, digital video tape, and the like. Computer-readable storage media 722 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 700.

Communications subsystem 724 provides an interface to other computer systems and networks. Communications subsystem 724 serves as an interface for receiving data from and transmitting data to other systems from computer system 700. For example, communications subsystem 724 may enable computer system 700 to connect to one or more devices via the Internet. In some embodiments communications subsystem 724 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 724 can provide wired network connectivity (e.g., Ethernet) in addition to or instead of a wireless interface.

In some embodiments, communications subsystem 724 may also receive input communication in the form of structured and/or unstructured data feeds 726, event streams 728, event updates 730, and the like on behalf of one or more users who may use computer system 700.

By way of example, communications subsystem 724 may be configured to receive data feeds 726 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 724 may also be configured to receive data in the form of continuous data streams, which may include event streams 728 of real-time events and/or event updates 730, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 724 may also be configured to output the structured and/or unstructured data feeds 726, event streams 728, event updates 730, and the like to one or more databases that may be in communication with one or more streaming data source computers coupled to computer system 700.

Computer system 700 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 700 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

As used herein, the terms "about" or "approximately" or "substantially" may be interpreted as being within a range that would be expected by one having ordinary skill in the art in light of the specification.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A memory cell comprising:
   a memory element comprising a first terminal and a second terminal; and
   a selector comprising:
      a first transistor between a first voltage and the first terminal of the memory element;
      a third transistor between the first transistor and the first terminal of the memory element, wherein the third transistor is of a same type as the first transistor;
      a second transistor between a second voltage and the first terminal of the memory element, wherein the first voltage is higher than the second voltage; and
      a fourth transistor between the second transistor and the first terminal of the memory element, wherein the fourth transistor is of a same type as the second transistor.

2. The memory cell of claim 1, wherein the memory element comprises a resistive random-access memory element.

3. The memory cell of claim 1, wherein the memory element comprises a resistive memory film.

4. The memory cell of claim 1, wherein the first voltage comprises a reset voltage greater than or about 3.3 V.

5. The memory cell of claim 1, wherein the second voltage comprises a ground voltage.

6. The memory cell of claim 1, wherein the first transistor comprises a P-channel fin-type field-effect transistor (P-finFET).

7. The memory cell of claim 1, wherein the second transistor comprises an N-channel fin-type field-effect transistor (N-finFET).

8. The memory cell of claim 1, wherein the second terminal of the memory element is coupled to a bit line of a memory array.

9. The memory cell of claim 1, wherein the first transistor is controlled by a first word line, and the second transistor is controlled by a second word line.

10. The memory cell of claim 9, wherein the first word line and the second word line are derived from a same word line input signal.

11. The memory cell of claim 1, wherein a gate of the third transistor is biased at a voltage that is about halfway between the first voltage and the second voltage, and a gate of the fourth transistor is biased at the voltage that is about halfway between the first voltage and the second voltage.

12. A selector of a memory cell, the selector comprising:
   a terminal configured to connect with a terminal of a memory element in the memory cell;
   a first transistor and a third transistor, wherein the first transistor is between a first voltage and the third transistor, and the third transistor is between the first transistor and the terminal; and
   a second transistor and a fourth transistor, wherein the second transistor is between a second voltage and the fourth transistor, the fourth transistor is between the second transistor and the terminal, and the first voltage is higher than the second voltage.

13. The selector of claim 12, wherein a gate of the third transistor is biased at a voltage that is about halfway between the first voltage and the second voltage.

14. The selector of claim 13, wherein a gate of the fourth transistor is biased at the voltage that is about halfway between the first voltage and the second voltage.

15. The selector of claim 12, wherein a gate of the first transistor and a gate of the second transistor are connected to outputs of a level shifter, wherein the level shifter is configured to receive a word line signal and convert the word line signal into separate control signals for the first transistor and the second transistor.

16. The selector of claim 12, wherein a gate of the first transistor is connected to a signal that switches between the first voltage and a voltage that is about halfway between the first voltage and the second voltage.

17. The selector of claim 12, wherein a gate of the second transistor is connected to a signal that switches between the second voltage and a voltage that is about halfway between the first voltage and the second voltage.

18. A method of selecting a memory element in a memory array, the method comprising:
   receiving a reset signal for the memory element in the memory array;
   in response to receiving the reset signal for the memory element, opening a conductive path from the memory element to a first voltage through a first transistor a third transistor that is in series with the first transistor;

receiving a set signal for the memory element in the memory array; and in response to receiving the set signal for the memory element, opening a conductive path from the memory element to a second voltage through a second transistor and a fourth transistor that is in series with the second transistor.

19. The method of claim 18, further comprising biasing a gate of the third transistor at a voltage that is about halfway between the first voltage and the second voltage.

20. The method of claim 18, further comprising, in response to receiving the set signal for the memory element, opening a conductive path from the memory element to a second voltage through a fourth transistor that is in series with the second transistor biasing a gate of the fourth transistor at a voltage that is about halfway between the first voltage and the second voltage.

* * * * *